(12) United States Patent
Constantin

(10) Patent No.: US 6,961,554 B1
(45) Date of Patent: Nov. 1, 2005

(54) POWER AMPLIFIER INCLUDING A DESENSITIZED BIAS CIRCUIT

(75) Inventor: Nicolas Constantin, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 375 days.

(21) Appl. No.: 10/252,187

(22) Filed: Sep. 23, 2002

(51) Int. Cl.[7] .............................................. H04B 1/16
(52) U.S. Cl. ................... 455/341; 455/343.1; 455/333; 333/285; 333/296
(58) Field of Search ............................ 455/341, 127.1, 455/343.1, 333, 307, 306, 298, 296, 251.1, 455/253.2, 127.3, 575.1, 550.1, 127.2, 127.4, 455/574, 422.1, 561, 424, 425, 553.1; 330/289, 330/266, 272, 279, 302, 306, 277, 288, 133, 330/286, 127, 199, 296, 134, 129, 285, 136, 330/297, 261, 254, 153, 264, 51, 311, 298; 327/530, 534, 535, 537, 540, 554, 556, 531, 327/543, 546, 544, 57, 51, 343, 103, 359, 327/427, 55

(56) References Cited

U.S. PATENT DOCUMENTS

| | | | |
|---|---|---|---|
| 4,924,194 A * | 5/1990 | Opas et al. | 330/289 |
| 5,905,409 A * | 5/1999 | Fujimoto et al. | 330/302 |
| 6,331,799 B1 * | 12/2001 | Miyazawa | 327/538 |
| 6,639,465 B2 * | 10/2003 | Samelis et al. | 330/129 |
| 2004/0251966 A1 * | 12/2004 | Yeh | 330/285 |

* cited by examiner

Primary Examiner—Edward F. Urban
Assistant Examiner—Charles Chow
(74) Attorney, Agent, or Firm—Smith Frohwein Tempel Greenlee Blaha LLC

(57) ABSTRACT

A desensitized bias circuit for a power amplifier includes, in one embodiment, a notch filter incorporated into the bias circuit. The notch filter behaves as a resonant circuit at the operating frequency of the power amplifier, thus coupling to ground any RF energy that migrates from the power amplifier input to the bias circuitry. The notch filter acts as a virtual ground to couple any RF energy present in the bias circuit to ground. Various implementations of the bias circuitry including the notch filter can be used. In other embodiments, the invention includes phase cancellation circuitry in the bias circuit to suppress any RF energy in the bias circuit.

17 Claims, 3 Drawing Sheets

POWER AMPLIFIER INCLUDING A DESENSITIZED BIAS CIRCUIT

BACKGROUND OF THE INVENTION

1. Field of the Invention

This invention relates generally to optimizing the tradeoff between efficiency and linearity in a radio frequency (RF) power amplifier in a wireless communication device transmitter, and, more particularly, to a power amplifier including a desensitized bias circuit.

2. Related Art

With the increasing availability of efficient, low cost electronic modules, mobile communication systems are becoming more and more widespread. For example, there are many variations of communication schemes in which various frequencies, transmission schemes, modulator techniques and communication protocols are used to provide two-way voice and data communications in a handheld telephone-like communication handset. While the different modulation and transmission schemes each have advantages and disadvantages, one common factor is the need for highly efficient power amplification. As these communication devices become smaller and smaller, the functionality provided by these devices continues to increase. One major concern when developing these handheld communication devices power consumed and dissipated become smaller and smaller, the amount of power consumed and dissipated becomes more and more critical. Efficient power amplification decreases the amount of power consumed, thereby maximizing battery life of the device.

Another major concern in these wireless devices is the size of the circuitry. In order to minimize the hardware required it is desirable to integrate as much functionality as possible into fewer and fewer circuit modules. This enables the handheld device to be smaller and consume less power.

Another matter of concern is maintaining a highly efficient level of amplification while preventing the radio frequency signal that is supplied to the power amplifier from being coupled back into the circuitry that is used to bias the power amplifier. For the bias circuitry to provide the most consistent bias voltage and current, it is important that the RF input signal not modulate the bias circuitry. When the RF input signal migrates into the bias circuitry, fluctuations are caused in the bias voltage. These fluctuations cause performance degradation and power output variations in the power amplifier.

Therefore, there is a need in the industry for a bias circuit for a power amplifier where the bias circuit is resistant or desensitized from any RF energy coupled back into the bias circuit.

SUMMARY

The invention provides a desensitized bias circuit for a power amplifier where any radio frequency (RF) energy present in the bias circuit is substantially eliminated. In one embodiment, a notch filter is incorporated into the bias circuit. The notch filter behaves as a resonant trap circuit at the operating frequency of the power amplifier, thus coupling to ground any RF energy that migrates from the power amplifier input to the bias circuitry. The notch filter acts as a virtual ground to couple any RF energy present in the bias circuit to ground and can be implemented using a variety of configurations. Various implementations of the bias circuitry including the notch filter can be used. In other embodiments, the invention includes phase cancellation circuitry in the bias circuit to suppress any RF energy in the bias circuit.

Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
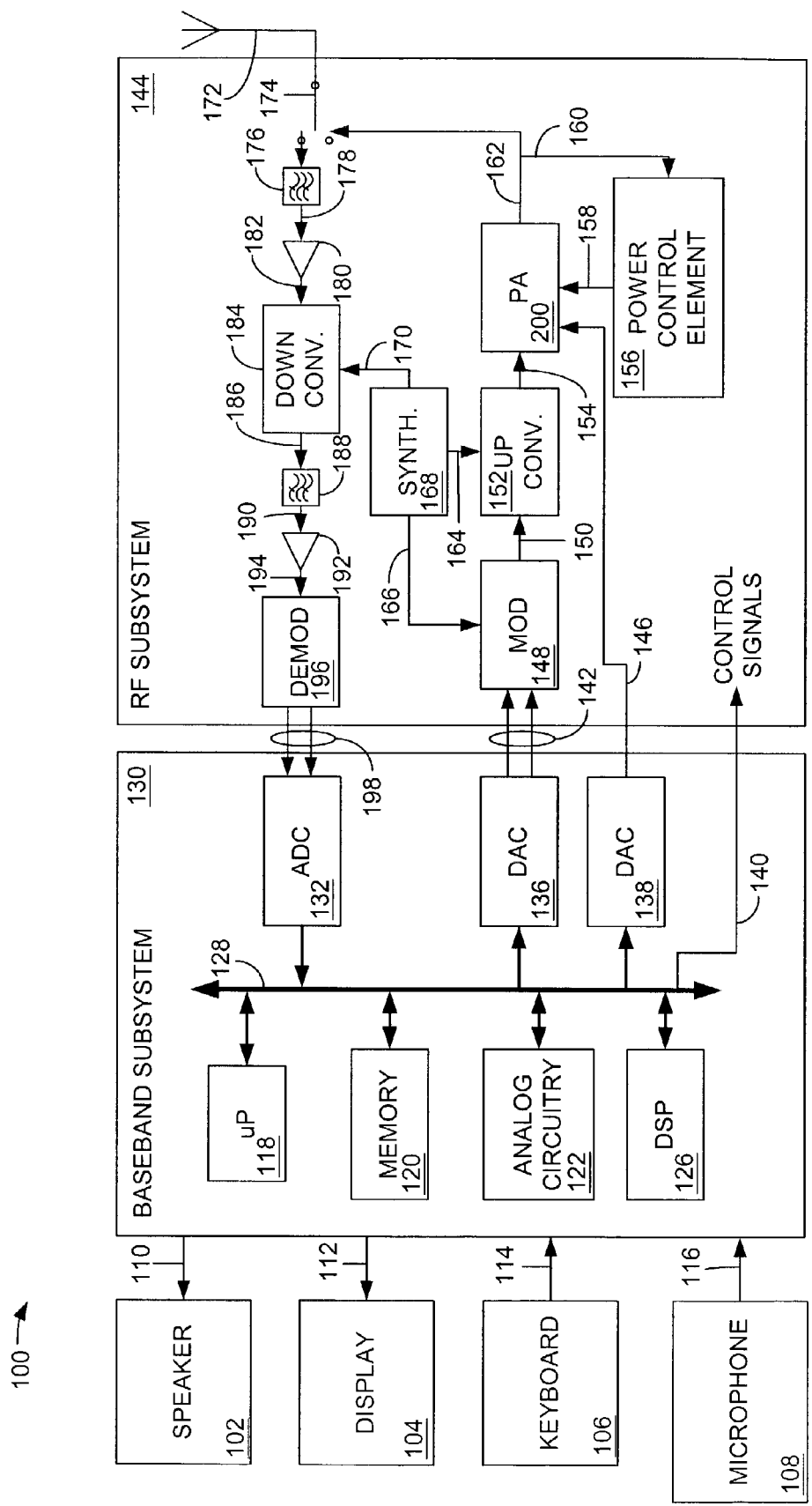
FIG. 1 is a block diagram illustrating a simplified portable transceiver.

Although described with particular reference to a portable transceiver, the power amplifier including a desensitized bias circuit can be implemented in any system where it is desirable to prevent RF energy from adversely affecting the bias circuit, and thus, the power amplifier. Furthermore, while shown as implemented using a single heterojunction bipolar transistor (HBT) power transistor for simplicity, the power amplifier including a desensitized bias circuit will typically be implemented using a plurality of power transistors and related bias circuitry using alternative amplifier technologies.

Furthermore, the power amplifier including a desensitized bias circuit can be implemented in software, hardware, or a combination of software and hardware. In a preferred embodiment(s), selected portions of the power amplifier including a desensitized bias circuit are implemented in hardware and software. The hardware portion of the invention can be implemented using specialized hardware logic. The software portion can be stored in a memory and can be executed by a suitable instruction execution system (microprocessor). The hardware implementation of the power amplifier including a desensitized bias circuit can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the power amplifier including a desensitized bias circuit software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 102, display 104, keyboard 106, and microphone 108, all connected to baseband subsystem 130. In a particular embodiment, portable transceiver 100 can be, for example but not limited to, a portable telecommunication handset such as a mobile cellular-type telephone. Speaker 102 and display 104 receive signals from baseband subsystem 130 via connections 110 and 112, respectively, as known to those having ordinary skill in the art. Similarly, keyboard 106 and microphone 108 supply signals to baseband subsystem 130 via connections 114 and 116, respectively. Baseband subsystem 130 includes microprocessor (μP) 118, memory 120, analog circuitry 122, and digital signal processor (DSP) 126 in communication via bus 128. Bus 128, although shown as a single bus, may be implemented using multiple busses connected as necessary among the subsystems within baseband subsystem 130. Microprocessor 118 and memory 120 provide the signal timing, processing and storage functions for portable transceiver 100. Analog circuitry 122 provides the analog processing functions for the signals within baseband subsystem 130. Baseband subsystem 130 provides control signals to RF subsystem 144 via connection 140. Although shown as a single connection 140, the control signals may originate from DSP 126 or from microprocessor 118, and are supplied to a variety of points within RF subsystem 144. It should be noted that, for simplicity, only the basic components of portable transceiver 100 are illustrated.

Baseband subsystem 130 also includes analog-to-digital converter (ADC) 132 and digital-to-analog converters (DACs) 136 and 138. ADC 132, DAC 136 and DAC 138 also communicate with microprocessor 118, memory 120, analog circuitry 122 and DSP 126 via bus 128. DAC 136 converts the digital communication information within baseband subsystem 130 into an analog signal for transmission to RF subsystem 144 via connection 142. DAC 138 provides a reference voltage power level signal to power control element 156 via connection 146. Connection 142, while shown as two directed arrows, includes the information that is to be transmitted by RF subsystem 144 after conversion from the digital domain to the analog domain.

RF subsystem 144 includes modulator 148, which after receiving a frequency reference signal, also called a local oscillator signal or LO from synthesizer 168 via connection 166, modulates the analog information on connection 142 and provides a modulated signal via connection 150 to upconverter 152. Upconverter 152 also receives a frequency reference signal from synthesizer 168 via connection 164. Synthesizer 168 determines the appropriate frequency to which upconverter 152 will upconvert the modulated signal on connection 150. The modulated signal on connection 150 may be any modulated signal, such as a phase modulated signal or an amplitude modulated signal. Furthermore, it is possible to supply a phase modulated signal to upconverter 152 and to introduce an amplitude modulated signal component into power amplifier 200 through the power amplifier's control channel. All possible modulation techniques can benefit from the invention to be described below.

Upconverter 152 supplies the modulated signal via connection 154 to power amplifier 200. Power amplifier 200 amplifies the signal on connection 154 to a variety of different power levels while maintaining a high efficiency level. Power amplifier 200 amplifies the modulated signal on connection 154 to the appropriate power level for transmission via connection 162 to antenna 172. Connection 162 may include an interface, such as, for example, an isolator or a filter. Illustratively, switch 174 controls whether the amplified signal on connection 162 is transferred to antenna 172 or whether a received signal from antenna 172 is supplied to filter 176. The operation of switch 174 is controlled by a control signal from baseband subsystem 130 via connection 140. Alternatively, a full-duplex communication architecture can be used to simultaneously send and receive signals.

A portion of the amplified transmit signal energy on connection 162 is supplied via connection 160 to power control element 156. Power control element 156, forms a closed power control feedback loop and, if desired, supplies an AM component of the transmit signal via control channel connection 158 to power amplifier 200.

As mentioned above, a signal received by antenna 172 will, at the appropriate time determined by baseband system 130, be directed via switch 174 to receive filter 176. Receive filter 176 will filter the received signal and supply the filtered signal on connection 178 to low noise amplifier (LNA) 180. Receive filter 176 is a bandpass filter, which passes all channels of the particular cellular system in which the portable transceiver 100 is operating. As an example, in a 900 MHz GSM system, receive filter 176 would pass all frequencies from 935.1 MHz to 959.9 MHz, covering all 124 contiguous channels of 200 kHz each. The purpose of this filter is to reject all frequencies outside the desired region. LNA 180 amplifies the very weak signal on connection 178 to a level at which downconverter 184 can translate the signal from the transmitted frequency back to a baseband frequency. Alternatively, the functionality of LNA 180 and downconverter 184 can be accomplished using other elements, such as for example but not limited to, a low noise block downconverter (LNB).

Downconverter 184 receives a frequency reference signal, also called a local oscillator signal or LO from synthesizer 168, via connection 170. This LO signal instructs the downconverter 184 as to the proper frequency to which to downconvert the signal received from LNA 180 via connection 182. The downconverted frequency is called the intermediate frequency or "IF". Downconverter 184 sends the downconverted signal via connection 186 to channel filter 188, also called the "IF filter". Channel filter 188 filters the downconverted signal and supplies it via connection 190 to amplifier 192. The channel filter 188 selects the one desired channel and rejects all others. Using the GSM system as an example, only one of the 124 contiguous channels is actually to be received. After all channels are passed by receive filter 176 and downconverted in frequency by downconverter 184, only the one desired channel will appear precisely at the center frequency of channel filter 188. The synthesizer 168, by controlling the local oscillator frequency supplied on connection 170 to downconverter 184, determines the selected channel. Amplifier 192 amplifies the received signal and supplies the amplified signal via connection 194 to demodulator 196. Demodulator 196 recovers the transmitted analog information and supplies a signal representing this information via connection 198 to ADC 132. ADC 132 converts these analog signals to a digital signal at baseband frequency and transfers it via bus 128 to DSP 126 for further processing.

Figure 2:
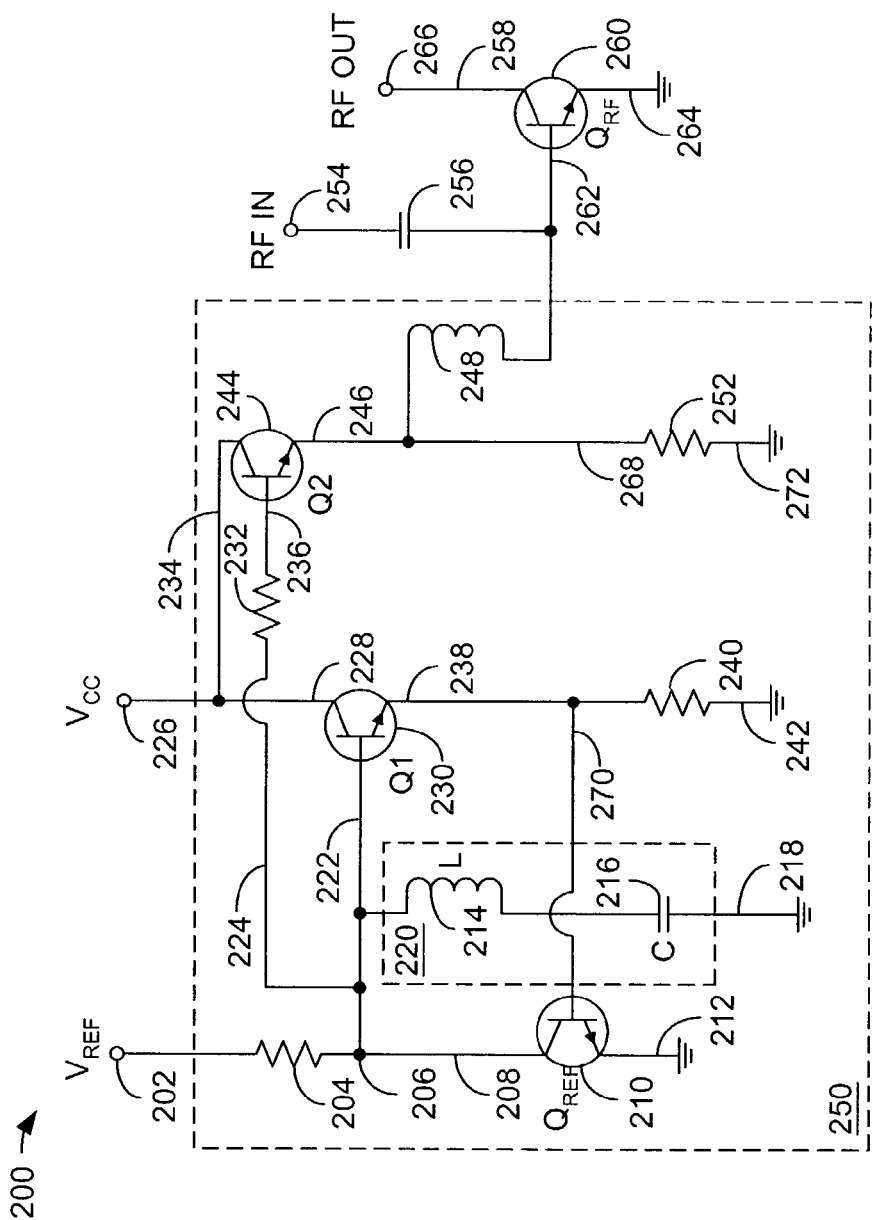
FIG. 2 is a schematic diagram illustrating the power amplifier of FIG. 1 including a desensitized bias circuit.

FIG. 2 is a schematic diagram illustrating the power amplifier 200 of FIG. 1 including a desensitized bias circuit. Power amplifier 200 includes active bias circuit 250 that provides a bias voltage to the base terminal 262 of power transistor 260. In operation, an RF input signal is supplied to node 254 and through capacitor 256 to the base terminal 262 of power transistor 260. Capacitor 256 couples the RF energy from node 254 to the base terminal 262 of power transistor 260 while preventing the passage of any direct current (DC) signals. Although illustrated as an npn bipolar junction transistor, power transistor 260 may also be of pnp variety and may also be fabricated using alternative processing methodologies. Power transistor 260 amplifies the input signal at the base terminal 262 and supplies an RF output signal designated "RF OUT" through collector 258 to node 266. The emitter terminal 264 of power transistor 260 is coupled to ground.

A voltage reference signal VREF is applied to node 202 and through resistor 204 to node 206. This voltage reference signal is supplied to the base terminal 222 of first bias transistor 230. The reference voltage at node 206 is also supplied to the collector terminal 208 of reference transistor 210. The emitter terminal 212 of reference transistor 210 is connected to ground. The base terminal 270 of reference transistor 210 is connected to the emitter terminal 238 of first bias transistor 230. The emitter terminal 238 and the collector terminal 270 are coupled through resistor 240 to ground 242.

A system voltage level, referred to as $V_{cc}$, is applied to node 226 and coupled to the collector terminal 228 of first bias transistor 230. The voltage $V_{cc}$ is also coupled to the collector terminal 234 of second bias transistor 244. The base terminal 236 of second bias transistor 244 is coupled through resistor 232 to the base terminal 222 of first bias transistor 230. The emitter terminal 246 of second bias transistor 244 is coupled through inductor 248 to the base terminal 262 of power transistor 260.

A voltage drop across the base terminal 270 and emitter terminal 212 of reference transistor 210 and a voltage drop across the base terminal 222 and emitter terminal 238 of first bias transistor 230 cause a regulated voltage signal to appear on connection 222. This regulated voltage is then supplied to the base terminal 236 of second bias transistor 244. Second bias transistor 244 buffers the voltage signal on connection 224 and allows current to flow through the second bias transistor 244 toward the base terminal 262 of power transistor 260. In this manner, active bias circuit 250 provides a regulated bias voltage to the base terminal 262 of power amplifier 260.

During operation, when an RF input signal designated "RF IN" is supplied via node 254 through capacitor 256 to the base terminal 262 of power transistor 260, some undesirable leakage of the RF signal may occur through the inductor 248 and into the emitter terminal 246 of second bias transistor 244. Although the inductor 248 is designed to pass a DC signal (the bias voltage signal) and to block any RF energy (the RF input signal supplied via node 254) some RF energy will invariably leak, or migrate, into the bias circuit through the emitter terminal 246 of second bias transistor 244. This RF energy leakage is coupled to the base terminal 236 of second bias transistor 244, thus appearing as an RF voltage across the base terminal 236 and emitter terminal 246 of second bias transistor 244. Through a rectification process of this RF signal across the emitter 246 and the base 236 of second bias transistor 244, an undesirable voltage fluctuation appears at the emitter 246 of second bias transistor 244. This RF voltage is also coupled to the base terminal 222 of first bias transistor 230, and causes an undesirable modulation of the voltage present at base terminal 222.

Because there is high gain present at the base terminal 222 of first bias transistor 230, any RF voltage leaking into the active bias circuit 250 and appearing at connection 224 will be multiplied, thereby causing significant fluctuation in the bias voltage signal. Because the voltage present at connection 222 is modulated by the RF energy migrating into the bias circuit, the voltage becomes unstable and causes the regulated voltage at node 224 to fluctuate. This voltage fluctuation causes the bias voltage on the base terminal 262 of power transistor 260 to fluctuate as a function of the RF signal, thereby causing undesirable performance variations in the power amplifier 200.

In order to prevent the detrimental effects that are caused when RF energy is coupled into the active bias circuit 250 through the second bias transistor 244, it is desirable to eliminate this RF energy present at the base of the reference transistor 210, first bias transistor 238 and second bias transistor 244. One manner of eliminating the RF signal in the active bias circuit 250 is the implementation of a notch filter 220 between the base terminal 222 of first bias transistor 230 and ground terminal 218. When operated at the same frequency as power amplifier 260, the notch filter 220 behaves as a resonant trap circuit, thereby trapping any RF energy present at base terminal 222 and coupling that RF energy directly to ground 218.

Notch filter 220 includes inductor 214 and capacitor 216, which are connected in series. When connected as shown, the notch filter 220 creates a virtual ground at the base terminal 236 of second bias transistor 244. Resistor 232 at the base terminal 236 of second bias transistor 244 distributes any RF voltage across the base terminal 236 and emitter terminal 246 of second bias transistor 244, thus reducing the RF voltage level across the base 236 and emitter 246 of second bias transistor 244. Resistor 232 reduces the undesirable rectification of the RF signal across the second bias transistor 244 and may improve the performance of the desensitized active bias circuit by improving the efficiency of the notch filter 220. In this manner, any RF signal energy that migrates past the inductor 248 into the second bias transistor 244 and the first bias transistor 230 will be coupled to ground through notch filter 220.

It should be noted that other implementations of the notch filter 200 can be used to reduce or eliminate the presence of RF energy in other implementations of the bias circuitry 250, and the notch filter 220 and active bias circuitry 250 are illustrated merely as an example. For example, while the power amplifier 200 uses heterojunction bipolar transistor (HBT) technology, field effect transistor (FET) and complementary metal oxide semiconductor (CMOS) technology can also benefit from aspects of the invention.

Figure 3:
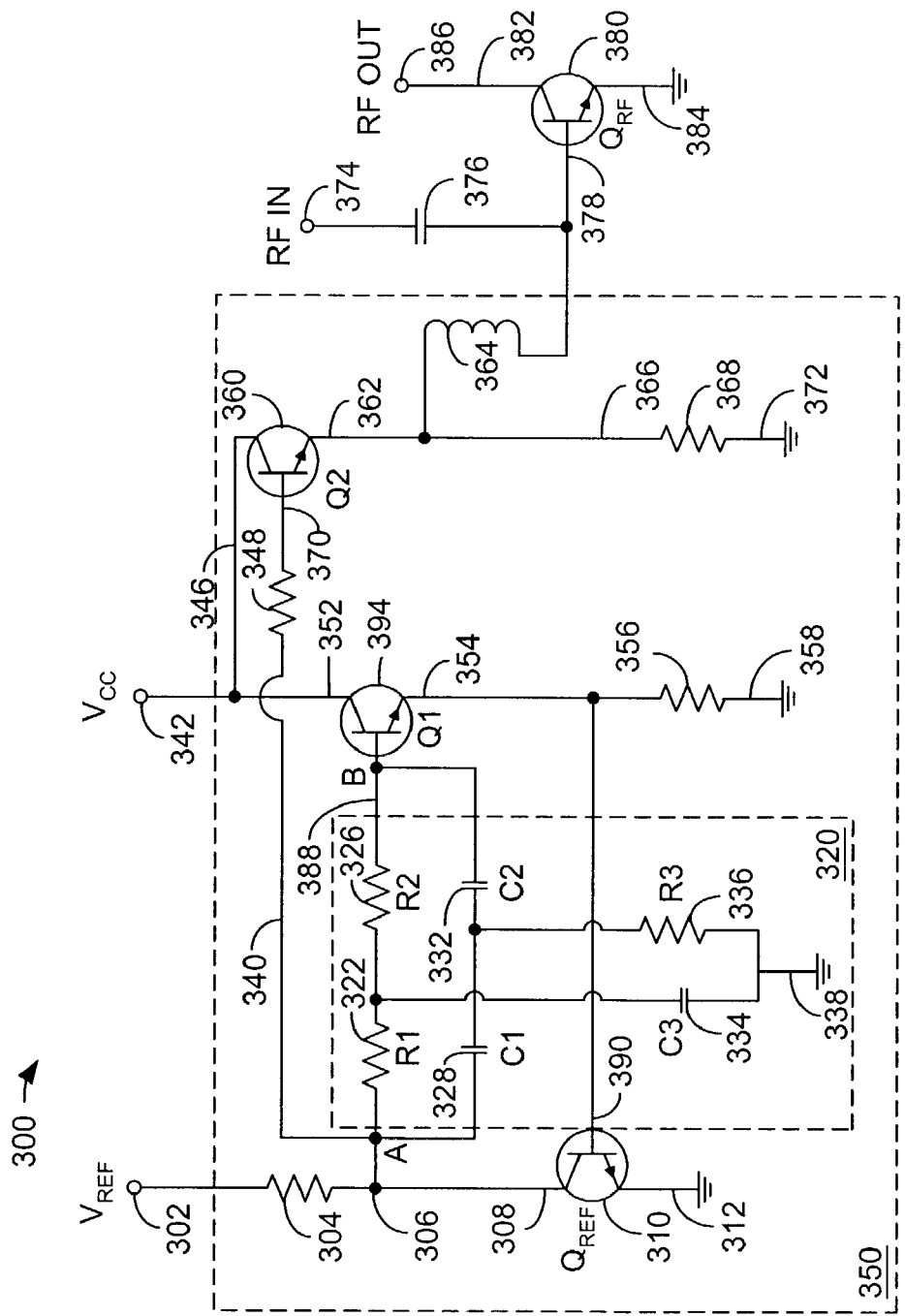
FIG. 3 is a schematic view illustrating another embodiment of the power amplifier of FIG. 2.

FIG. 3 is a schematic view illustrating another embodiment 300 of the power amplifier 200 of FIG. 2. When implementing the notch filter 220 of FIG. 2, the inductor 214 typically requires a large amount of space on the integrated circuit, thereby making integration of the inductor 214 and a capacitor 216 along with the remaining circuitry difficult. Furthermore, process variations when fabricating the inductor 214 and the capacitor 216 reduce the efficiency of the notch filter 220, which is designed to operate optimally at a particular frequency (i.e., the resonant frequency defined by the operating frequency of the power transistor 260). In order to reduce processing and manufacturing complexity and minimize process variations, it may be desirable to implement the notch filter using only resistive and capacitive elements.

Referring now to FIG. 3, the notch filter 320, which performs similar in function to the notch filter 230 of FIG. 2, but operates instead as a phase cancellation device, is implemented using only resistive and capacitive elements. The reference voltage signal $V_{REF}$ is applied to node 302 and supplied through resistor 304 to node 306. The collector terminal 308 of reference transistor 310 receives the voltage reference signal $V_{REF}$ while the emitter terminal 312 of reference transistor 310 is coupled to ground. The notch filter 320 includes a node, or port, labeled "A", coupled through connection 340 and resistor 348 to the base terminal 370 of second bias transistor 360. A second node, labeled "B", of notch filter 320 is coupled to the base terminal 388 of first bias transistor 394. The emitter terminal 354 of first bias transistor 394 is coupled to the base terminal 390 of reference transistor 310. These terminals are coupled to ground 358 through resistor 356.

The system voltage level $V_{cc}$ is supplied via node 342 to the collector terminal 352 of first bias transistor 394 and to the collector terminal 346 of second bias transistor 360. The emitter terminal 354 of first bias transistor 394 is coupled to the base terminal 390 of reference transistor 310, both of which are coupled to ground 358 through resistor 356. The base terminal 370 of second bias transistor 360 is coupled through resistor 348 to node A. The emitter terminal 362 of second bias transistor 360 supplies the bias voltage signal through inductor 364 to the base terminal 378 of power transistor 380.

The RF input signal is supplied through node 374 and through capacitor 376 to the base terminal 378 of power transistor 380 The output node labeled RF OUT of power transistor 380, which is an amplified version of the RF input signal labeled RF IN, is supplied via collector terminal 382 out through node 386. The emitter terminal 384 of power transistor 380 is coupled to ground.

As described above with respect to FIG. 2, a portion of the RF energy input through node 374 through capacitor 376 to base terminal 378 is coupled back through inductor 364 to the emitter terminal 362 of second bias transistor 360. This creates an RF voltage level across the base terminal 370 and emitter terminal 362 of the second bias transistor 360, and in turn creates an undesirable voltage fluctuation at the base terminal 388 of the first bias transistor 354. This RF voltage level also appears on connection 340 at node A. In response to this RF voltage appearing at node A, the notch filter 320 suppresses the RF energy present at node B. The notch filter 320 suppresses the RF energy present at node B by performing phase cancellation on the RF signal present at node B.

Notch filter 320 includes resistor 322, resistor 326, resistor 336, capacitor 328, capacitor 332 and capacitor 334. The combination of resistor 322, resistor 326 and capacitor 334 forms a first branch of notch filter 320, the branch creating a phase lag applied to the RF voltage present at node B. The phase lag applied to the signal at node B can be, for example, approximately +90°, but may vary therefrom. Capacitor 328, capacitor 332 and resistor 336 form a second branch of the notch filter 320, the second branch creating a phase lead applied to the RF voltage present at node B. The phase lead applied to the signal at node B can be, for example, approximately −90°, but may vary therefrom. The active bias circuitry 350 can operate over a large frequency bandwidth and, as such, the phase lag and lead of the cancellation signals applied to node B may vary. In this manner, at the node labeled B, these two signal responses that are opposite in phase to each other, but substantially equal in amplitude, suppress any RF voltage present at node B. The implementation of notch filter 320 using only resistive and capacitive elements significantly reduces the overall dimension of the circuitry.

Furthermore, the resistive and capacitive elements within the notch filter 320 can be tuned with much higher precision to operate at the proper resonant frequency corresponding to that of power transistor 380, thus allowing virtually all of the RF energy coupled back through second bias transistor 360 to be suppressed. Further, the values of the capacitors 328, 332 and 334 are smaller than the value of the capacitor 216 of FIG. 2, thereby further reducing the overall dimension of the notch filter 320.

The resistor 348 coupled to the base terminal 370 of second bias transistor 360 performs similarly to that of the resistor 232 coupled to the base terminal 236 of second bias transistor 244 of FIG. 2. This resistor 348, in turn, reduces the RF voltage across the base-emitter junction of second bias transistor 360 and improves the efficiency of the notch filter 320. It should be noted that, instead of the notch filter 320, any phase cancellation network could be used to suppress the RF signal present in the active bias circuit 350.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for operating a power amplifier including a desensitized bias circuit, comprising the steps of:
   providing a radio frequency (RF) power transistor;
   coupling bias circuitry to the RF power transistor, the bias circuitry comprising a reference transistor, a first bias transistor, a second bias transistor, and a notch filter, the notch filter comprising an inductor and a capacitor, the inductor having a first terminal coupled to a base terminal of the first bias transistor; and
   eliminating substantially any RF signal present in the bias circuitry.

2. The method of claim 1, further comprising the step of coupling any RF signal present in the bias circuitry to ground.

3. The method of claim 1, further comprising the step of suppressing any RF signal present in the bias circuitry by applying opposite phase signals to the RF signal.

4. A power amplifier including a desensitized bias circuit, comprising:
   a radio frequency (RF) power transistor having a base terminal, a collector terminal and an emitter terminal;
   bias circuitry coupled to the base terminal of the RF power transistor; and
   a notch filter included in the bias circuitry, wherein the bias circuitry comprises a a first bias transistor, a second bias transistor, and a reference transistor, wherein the notch filter comprises an inductor and a capacitor, the inductor having a first terminal coupled to the base terminal of the first bias transistor and a second terminal coupled to a first terminal of the capacitor and the capacitor has a second terminal coupled to ground.

5. The amplifier of claim 4, further comprising:
an RF input signal applied to the base terminal of the RF power transistor; and
wherein the notch filter provides a ground path for any RF signal energy coupled from the base terminal of the RF power transistor to the base terminal of the second bias transistor.

6. The amplifier of claim 4, wherein the bias circuitry comprises:
a reference transistor, a first bias transistor and a second bias transistor, each of the transistors including a base terminal, a collector terminal and an emitter terminal.

7. The amplifier of claim 6, further comprising:
an RF input signal applied to the base terminal of the RF power transistor; and
wherein the notch filter provides a ground path for any RF signal energy coupled from the base terminal of the RF power transistor to the base terminal of the second bias transistor.

8. A desensitized bias circuit for a radio frequency (RF) power amplifier, comprising:
a reference transistor, a first bias transistor and a second bias transistor, each of the transistors including a base terminal, a collector terminal and an emitter terminal;
a radio frequency (RF) power transistor having a base terminal coupled to the emitter terminal of the second bias transistor; and
a notch filter configured to conduct any RF signal present at the emitter terminal of the second bias transistor to ground, the notch filter having a first terminal coupled to a base terminal of the first bias transistor.

9. The circuit of claim 8, wherein the notch filter comprises an inductor and a capacitor, the inductor coupled to the base terminal of the first bias transistor and to a first terminal of the capacitor, the capacitor having a second terminal coupled to ground.

10. The amplifier of claim 8, wherein the notch filter comprises:
a pair of series coupled resistors arranged in parallel with a pair of series coupled capacitors;
a third capacitor coupled between the pair of series coupled resistors;
a third resistor coupled between the pair of series coupled capacitors, wherein the third capacitor and the third resistor are coupled to ground.

11. A power amplifier including a desensitized bias circuit, comprising:
means for providing a radio frequency (RF) power transistor having a base terminal, a collector terminal and an emitter terminal;

coupling means for coupling bias circuitry to the base terminal of the RF power transistor, the bias circuitry comprising a reference transistor, a first bias transistor, a second bias transistor, and a notch filter, the notch filter having a first terminal coupled to a base terminal of the first bias transistor; and
suppression means for eliminating any RF signal present in the bias circuitry.

12. The amplifier of claim 11, wherein the suppression means comprises means for coupling any RF signal present in the bias circuitry to ground.

13. The amplifier of claim 12, wherein the notch filter is operated at a resonant frequency corresponding to the operating frequency of the power transistor.

14. The amplifier of claim 11, wherein the suppression means comprises means for applying opposite phase signals to any RF signal present in the bias circuitry.

15. A portable communication handset having a radio frequency (RF) power amplifier including a desensitized bias circuit, comprising:
bias circuitry coupled to the power amplifier, the bias circuitry including a reference transistor, a first bias transistor and a second bias transistor, each of the transistors including a base terminal, a collector terminal and an emitter terminal;
a radio frequency (RF) power transistor having a base terminal coupled to the emitter terminal of the second bias transistor; and
a notch filter included in the bias circuitry, the notch filter having a first terminal coupled to a base terminal of the first bias transistor, the notch filter configured to conduct any RF signal present at the emitter terminal of the second bias transistor to ground.

16. The portable communication handset of claim 15, wherein the notch filter comprises an inductor and a capacitor, the inductor having a first terminal coupled to the base terminal of the first bias transistor and a second terminal coupled to a first terminal of the capacitor and the capacitor has a second terminal coupled to ground.

17. The portable communication handset of claim 15, wherein the notch filter comprises:
a pair of series coupled resistors arranged in parallel with a pair of series coupled capacitors;
a third capacitor coupled between the pair of series coupled resistors;
a third resistor coupled between the pair of series coupled capacitors; and
wherein the third capacitor and the third resistor are coupled to ground.

* * * * *